United States Patent [19]
Tepman et al.

[11] Patent Number: 5,879,575
[45] Date of Patent: Mar. 9, 1999

[54] SELF-CLEANING PLASMA PROCESSING REACTOR

[75] Inventors: Avi Tepman, Cupertino; Yan Ye, Campbell, both of Calif.

[73] Assignee: Applied Materials, Inc., Santa Clara, Calif.

[21] Appl. No.: 976,539

[22] Filed: Nov. 21, 1997

Related U.S. Application Data

[63] Continuation of Ser. No. 564,825, Nov. 29, 1995, abandoned.

[51] Int. Cl.$^6$ .................................................. H05H 1/00
[52] U.S. Cl. ........................... 216/68; 438/905; 438/729; 118/723 I; 118/723 MP; 156/345
[58] Field of Search ............................. 216/68; 438/905, 438/729; 118/723 I, 723 MP; 156/345

[56] References Cited

U.S. PATENT DOCUMENTS

| | | | |
|---|---|---|---|
| 4,786,392 | 11/1988 | Kruchowski et al. | 156/345 X |
| 5,252,178 | 10/1993 | Moslehi | 156/345 X |
| 5,431,769 | 7/1995 | Kisakibaru et al. | 156/345 |
| 5,514,246 | 5/1996 | Blalock | 156/643.1 |
| 5,523,261 | 6/1996 | Sandhu | 118/723 E |

FOREIGN PATENT DOCUMENTS

| | | | |
|---|---|---|---|
| 0 680 072 A2 | 11/1995 | European Pat. Off. | H01J 37/32 |
| 0777258A2 | 4/1997 | European Pat. Off. | H01J 37/32 |

*Primary Examiner*—Thi Dang
*Attorney, Agent, or Firm*—Limbach & Limbach

[57] ABSTRACT

A method for simultaneously processing a workpiece using a plasma and cleaning the reactor in which processing takes place is disclosed. The plasma generated in the reactor performs simultaneous workpiece processing and reactor cleaning. Reactor cleaning may be accomplished by directing a portion of the plasma at an inner surface of the reactor such as by a power source auxiliary to that used to produce the processing plasma. An apparatus for carrying out a method for simultaneously processing a workpiece with a plasma and cleaning a reactor of etch residues generated from processing is disclosed.

26 Claims, 6 Drawing Sheets

SELF-CLEANING PLASMA PROCESSING REACTOR

This is a continuation of application Ser. No. 08/564,825 filed on Nov. 29, 1995, now abandoned.

BACKGROUND

Field of the Invention

Solid state devices and integrated circuits are now routinely fabricated with sub-micron or even nanometer scale components. These reductions in scale have led to great improvements in the operating characteristics of solid state devices. However, the small size of the device components has also led to new problems in device fabrication.

Traditionally, liquid etching techniques were used in device manufacture. However, since these techniques are limited to the fabrication of components with lateral dimensions of a micron or greater, they cannot be used for the production of nano-scale devices. Instead, dry etching techniques are now extensively used in the manufacture of solid state devices.

Of these dry etching techniques, plasma enhanced etching ("plasma etching") is very well suited to the fabrication of metal and semiconductor components on the nanometer scale. For this reason, plasma etching has become a commercially valuable technique. Any improvement in the productivity of this process would be a significant breakthrough.

A conventional plasma etching reactor includes a reactor vessel and a means for producing a plasma within the reactor vessel. The plasma may be produced either inductively, e.g., using an inductive RF coil, or capacitively, e.g., using a parallel plate glow discharge reactor.

The conventional steps involved in plasma etching are as follows. A mask is overlaid on an exposed surface of a wafer to be etched, and the wafer, or a batch of wafers, is then placed in the reactor vessel. Etching gases are then introduced into the reactor vessel and a plasma is ignited. During processing, the reactive species in the plasma etch the exposed surface of the metal or dielectric material.

At the molecular level, the etch process is a reaction between the reactive species in the plasma and exposed surface layers of the wafer. This reaction yields etch byproducts: small volatile molecules that desorb from the substrate surface and subsequently diffuse away into the reactor vessel. Most of these volatile byproducts are then pumped out of the reactor vessel. Unfortunately, these volatile byproducts can react with water vapor, oxygen, and organic contaminants that may be present in the reactor vessel and thereby form heavier, less volatile byproducts. In addition, some non-volatile species generated as a result of ion bombardment or sputtering can deposit on the vessel walls.

These heavier byproducts, together with excess coating polymer and various contaminants, can deposit on the inner surfaces of the reactor vessel. Each time a batch of wafers is processed, a fresh layer of byproducts and contaminants deposits on the inner surfaces of the reactor vessel. Eventually, these deposits become thick enough to flake off and detach from the reactor walls. This is a major source of particulate contaminants. These contaminants are very harmful to the fabrication process because they lodge in the mask or on the wafer and produce defects. As the size of the etched features becomes smaller, the effects of the particulate contaminants becomes more pronounced, and the need to eliminate these contaminants becomes more important.

Currently, two cleaning methods are used to remove the deposit buildup on the inner surfaces of the reactor walls: the wet cleaning method and the dry cleaning method.

In the wet cleaning method, the reactor is taken off line, dismantled, and the deposit buildup is physically or chemically removed. This cleaning method has at least two major drawbacks. First, the cleaning may take up to 24 hours in which time no processing can take place. Second, the dismantling, mechanical or chemical cleaning, and reassembling of the reactor are labor-intensive and complicated procedures, and can themselves lead to additional sources of contamination.

In the dry cleaning method, the processing of the wafers is alternated with a "dry clean" run. In the dry clean run, a dummy wafer is placed in the reactor vessel, the reactor is then charged with a mixture of cleaning gasses, and a plasma is ignited. The deposits on the inner surface of the reactor vessel are then chemically removed by reaction with reactive species and ion bombardment in the cleaning gas plasma. The dry clean method also has several major drawbacks. First, to maintain a high level of cleanliness in the reactor, it is preferable to carry out a cleaning run after each batch of wafers is processed. This results in considerable down time in which no productive processing can take place. Second, the gasses used in the cleaning run can be corrosive to some of the reactor vessel components. Third, dry clean species remaining in the chamber after a dry clean run can adversely impact subsequent wafer processing.

For these reasons, there is a real need for a reactor cleaning method that neither interrupts plasma processing nor involves potentially damaging mechanical or chemical processes. The present invention fills both of these needs and greatly improves the productivity of plasma processing reactors.

SUMMARY

The present invention is directed to a method and apparatus for self-cleaning of plasma processing reactors. It overcomes drawbacks of conventional cleaning methods by using the same gasses for both cleaning and plasma processing and by performing these two steps simultaneously. Since the reactor vessel is constructed of materials which are unaffected by the etching gasses, the cleaning step does not damage the reactor. Furthermore, because the plasma processing and cleaning steps are carried out simultaneously, the present invention avoids any cleaning downtime. Simultaneous plasma processing and self-cleaning is accomplished by directing a portion of the etching plasma at the inner surface of the reactor walls while the workpiece is being processed.

In designing a self-cleaning reactor, two competing factors must be considered. First, a sufficient portion of the plasma must be directed at the reactor walls to achieve the required cleaning. Second, the portion of the plasma directed at the walls must not be so large as to substantially diminish the plasma processing of the metal or semiconductor wafers (here, called the "workpiece"). A balance between these two competing factors may be achieved in the following way: The plasma etching reactor is first charged with a gas (or mixture of gasses) that is capable of sustaining a plasma, and a plasma is ignited. During processing, RF power is delivered to the means for producing the plasma whereby the plasma is maintained in the reactor and ions and other reactive species are generated to etch the workpiece. Simultaneously with the processing of the workpiece, a sufficient amount of RF power is delivered to a cleaning electrode to enhance ion bombardment on a portion of the inner surface of the reactor vessel. The cleaning electrode is such that the portion of the plasma directed at the inner surface of the reactor vessel is capable of cleaning the inner surface of the reactor vessel without substantially effecting the processing of the workpiece.

An apparatus for carrying out a method according to the present invention may incorporate relatively simple modifications to a conventional plasma etching reactor. For example, the plasma may be sustained by an RF coil encircling the reactor vessel. One or more moving conductive strips (or elements of varying sizes and geometries) may be electrically coupled to the coil to generate an electric field and thereby enhance ion bombardment of a section of the inner reactor surface while workpiece processing continues. Since the electrode moves, a large area of the inner surface of the chamber can be cleaned easily.

BRIEF DESCRIPTION OF THE DRAWINGS

The various features of the present invention may be more fully understood with reference to the following description, and the accompanying drawings in which.

DETAILED DESCRIPTION

Figure 1:
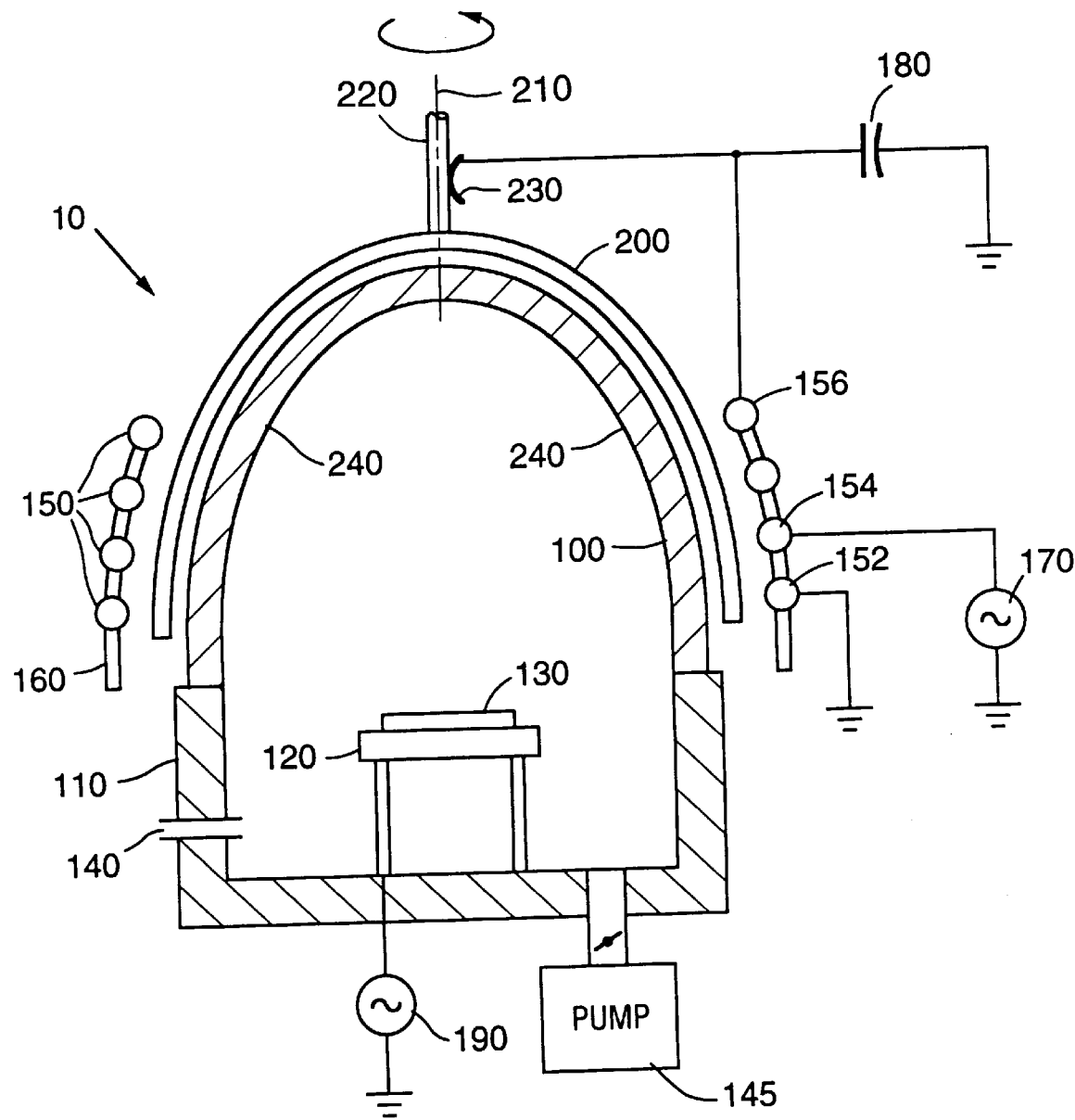
FIG. 1 shows a simplified full sectional view of one embodiment of the present invention.

The present invention is directed to a method and apparatus for the plasma processing of a workpiece and the simultaneous cleaning of the inner walls of the reactor vessel. The workpiece may be a wafer with conductive or dielectric layers. The conductive layer may be aluminum (Al), tungsten or silicon and the dielectric may be an oxide or nitride of silicon.

Generally, simultaneous cleaning and processing according to the present invention, i.e., "self-cleaning," can be carried out in the following manner:

First, the workpiece is placed in the reactor vessel and an etchant gas or mixture of etchant gasses capable of sustaining a plasma is introduced into the reactor vessel. Suitable gasses for Al etching include halogen gasses, halogen-containing gasses, and halocarbon gasses, and, more specifically, chlorine-containing gasses such as dichlorine ($Cl_2$) and boron trichloride ($BCl_3$). Suitable gasses for Si etching include fluorocarbon gasses such as carbon tetrafluoride ($CF_4$) and trifluoromethane ($CHF_3$). Optionally, an inert carrier gas may be added to the etching gasses. Suitable inert gasses are nitrogen-containing gasses such as dinitrogen ($N_2$). Optionally, a patterned photoresist may be applied to the workpiece prior to plasma etching. The photoresist defines the etched features.

Power is supplied to the reactor vessel in order to produce and maintain a plasma in the reactor vessel. The RF power may be coupled into the vessel either inductively or capacitively. An RF coil wound around the reactor vessel is an example of an inductive means and a reactor having parallel plate electrodes is an example of a capacitive means. Reactive species in the plasma react with the exposed surfaces of the workpiece to form volatile etch byproducts. Thus, the workpiece is etched.

Simultaneously with the processing of the workpiece, RF power is supplied to a cleaning electrode to enhance ion bombardment of the chamber. The amount of power delivered is sufficient to offset the deposition rate. Because the cleaning electrode moves, its size can be relatively small. In this way, simultaneous self-cleaning and plasma processing are achieved without substantially diminishing the processing of the workpiece.

In one embodiment of the present invention, the self-cleaning plasma reactor includes a reactor vessel, a means for producing a plasma, and a means for supplying power to the cleaning electrode. The main RF power produces and sustains a plasma in the reactor vessel and control ion bombardment on the wafer surface and the additional RF power controls ion bombardment at the inner surface of the reactor vessel. Cleaning occurs simultaneously with the processing of the workpiece and without substantially diminishing the processing of the workpiece.

The means for producing the main RF power may be an inductive means or a capacitive means. Suitable inductive means include an inductive RF coil arranged outside of the reactor vessel and suitable capacitive means include a parallel plate reactor design. In the embodiments of the present invention, an RF coil wound around the outside of the reactor vessel is a preferred means for producing the first electromagnetic field.

In the present invention, a moving cleaning electrode directs a cleaning portion of the plasma at a section of the inner surface of the reactor vessel that has an area that is smaller that the inner surface area of the reactor vessel and has a time-varying spatial position thereon. Thus, only a section of the inner surface of the reactor vessel is cleaned at any one time and the cleaning therefore uses only a small portion of the plasma. In this way, the cleaning does not substantially effect the plasma processing of the workpiece. Furthermore, by time-varying the position of the cleaning electrode, the majority of the inner surface of the reactor may be cleaned.

Suitable means for producing the additional RF power for the cleaning electrode include a conducting strip that is pivotally mounted outside of the reactor vessel. The area of the conducting strip is smaller than the inner surface area of the reactor vessel and the strip is electrically connected to the means for producing the main RF power. Alternatively, the conducting strip may be electrically connected to an RF power source that is separate from the main RF power. The conducting strip directs a cleaning portion of the plasma at the section of the inner surface of the reactor vessel that is adjacent to the strip. To accomplish simultaneous cleaning and processing, the area of the conducting strip is chosen to be large enough to achieve self-cleaning but not so large as to substantially effect the processing of the workpiece.

To vary the position of the cleaning electrode, a means for rotating the conducting strip about the reactor vessel may be used. A suitable means for rotating the strip is an electric motor connected to the strip. It is preferred that the conducting strip conforms with the outer surface of the reactor vessel—that is, has substantially the same shape as the outer surface of the reactor vessel, yet is free to move, e.g., rotate, independently of the outer surface of the reactor vessel. It is also preferred that the RF coil used for supplying RF power for the plasma conforms with the outer surface of the reactor vessel and that the conducting strip is arranged between the outer surface of the reactor vessel and the RF coil.

Means for supplying RF power to the cleaning electrode may also take the form of several conducting strips arranged outside of the reactor vessel and electrically insulated from each other. A coupling device may be used to electrically connect the conducting strips to the means for supplying RF power for the plasma. Again, the conducting strips may be electrically connected to an RF power source that is different from the means for supplying RF power for the plasma. The coupling device operates so that at any one time a subset of the conducting strips are connected to the means for supplying RF power for the plasma. The RF power supplied to the connected strips permits a cleaning portion of the plasma to be directed at a section of the inner surface of the reactor vessel that is adjacent to the connected strips. The coupling device is designed so that the subset of connected strips has a total area that is smaller than the inner surface area of the reactor vessel, and the conducting strips that are members of the connected subset varies in time. To accomplish simultaneous cleaning and processing, the total area of the connected strips is chosen to be large enough to achieve self-cleaning but not so large as to substantially diminish the processing of the workpiece. To fulfill these requirements, it is preferred that the connected strips have an area of less than about 20% of the area of the inner surface of the reactor vessel.

It is preferred that the conducting strips conform with the outer surface of the reactor vessel. It is also preferred that the RF coil used for supplying RF power for the plasma conforms with the outer surface of the reactor vessel and that the conducting strips are arranged between the outer surface of the reactor vessel and the RF coil.

In another embodiment of the present invention, the self-cleaning plasma reactor includes a reactor vessel and an RF coil wound about the reactor vessel. The RF coil produces power with an inductive component and a capacitive component. The geometry and power supplied by the coil are chosen so that the inductive component produces and sustains a plasma in the reactor vessel and the capacitive component directs at the inner surface of the reactor vessel a cleaning portion of the plasma without substantially diminishing the processing of the workpiece. Since the inductive and capacitive components of the RF power are delivered to the chamber simultaneously, the self-cleaning and the processing of the workpiece also occur simultaneously. The capacitive component of the RF power directs a portion of the plasma at the section of the inner surface of the reactor vessel that is adjacent to windings of the RF coil. Only a section of the inner surface of the rector vessel is therefore cleaned at any one time and the cleaning portion of the plasma is relatively small. In this way, the cleaning does not substantially effect the plasma processing of the workpiece.

In yet an other embodiment of the present invention, the RF coil is pivotally mounted outside of the reactor vessel. A means for rotating the RF coil about the reactor vessel is also included. A suitable means for rotating the RF coil is an electric motor connected to the RF coil. It is also preferred that the RF coil conforms with the outer surface of the reactor vessel. Since the RF coil rotates, the section of the inner surface of the reactor vessel that is cleaned varies with time and in this way, the majority of the inner surface of the reactor vessel is cleaned.

As will be appreciated by those of skill in the art, suitable reactor vessels may be dome shaped or cylindrical, or may be of other geometries suitable for plasma processing.

These and other features of the invention will become better understood with reference to the following prophetic examples.

EXAMPLE 1

Figure 2:
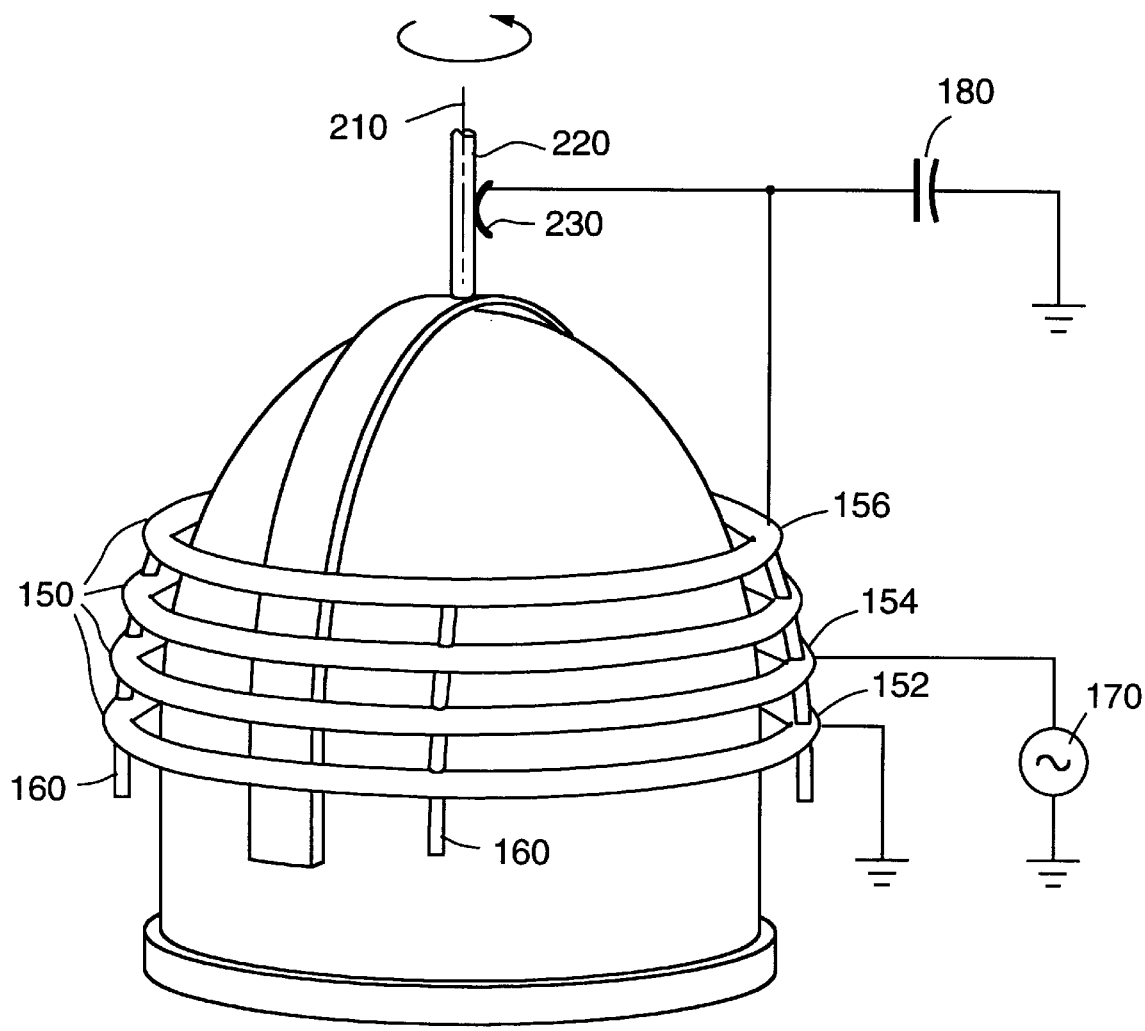
FIG. 2 shows a perspective top view of the embodiment shown in FIG. 1.

FIGS. 1 and 2 show a plasma reactor 10 that includes a reactor ceiling 100 mounted on a side wall 110. Both the ceiling 100 and side wall 110 may be made of conventional materials, such as an insulating refractory material including ceramics or quartz. Inside of the reactor vessel, a pedestal 120 supports the workpiece 130. A gas inlet port 140 supplies the etching gasses to the interior of the reactor vessel and an outlet port and pump 145 are used for extracting gasses from the reactor vessel.

An RF coil 150 encircles the outside of the reactor vessel and is supported on a coil support 160 outside of the reactor ceiling 100. One end 152 of the coil is grounded, an RF power source 170 is connected to a tap at a winding 154 along the coil, and a capacitor 180 is connected across the coil. The capacitance of the capacitor is chosen to resonate with the coil at the frequency of the RF power source 170, and the position of the tap 154 is chosen to match the output impedance of the RF power source 170.

The pedestal 120 may be either grounded—during plasma ignition—or connected to a bias power source 190 to control the kinetic energy of the plasma ions near the workpiece 130 during processing.

In addition to the RF coil, a conducting strip 200 is pivotally mounted outside of the reactor vessel. The strip 200 is positioned between the reactor ceiling 100 and the RF coil 150. Furthermore, the strip is free to rotate and is pivoted about a pivot axis 210. The strip is connected to an electric motor (not shown) by a connecting rod 220. The strip 200 is also electrically connected to a winding of the RF coil 156 through the connecting rod 220 and an electrical connecting component 230. The connecting component 230 could be a carbon brush or other component as known in the art.

In preparation for processing, the reactor vessel is charged with etching gasses through the inlet port 140. The RF power source 170 supplies power to the RF coil 150. This power is inductively coupled to the gasses inside the reactor vessel and ignites a plasma. Alternatively, the plasma may be ignited capacitively using an additional electrode (not shown).

The plasma is directed towards the workpiece 130 and achieves the desired processing of the workpiece.

Simultaneously with the processing of the workpiece, a portion of the plasma is directed towards the inner surface of the reactor vessel 240 by means of power supplied to the conducting strip 200. A portion of the plasma is directed at the inner surface of the reactor vessel adjacent to the strip. By choosing the strip to have a small enough area, the portion of the plasma used to clean the inner surface is small enough that the processing of the workpiece is not substantially diminished. To clean the majority of the inner surface of the reactor vessel, the strip is rotated and hence the cleaning portion of the plasma is directed at different positions on the inner surface. The cleaning portion of the plasma is always small enough that the workpiece processing is not substantially diminished.

EXAMPLE 2

Figure 3:
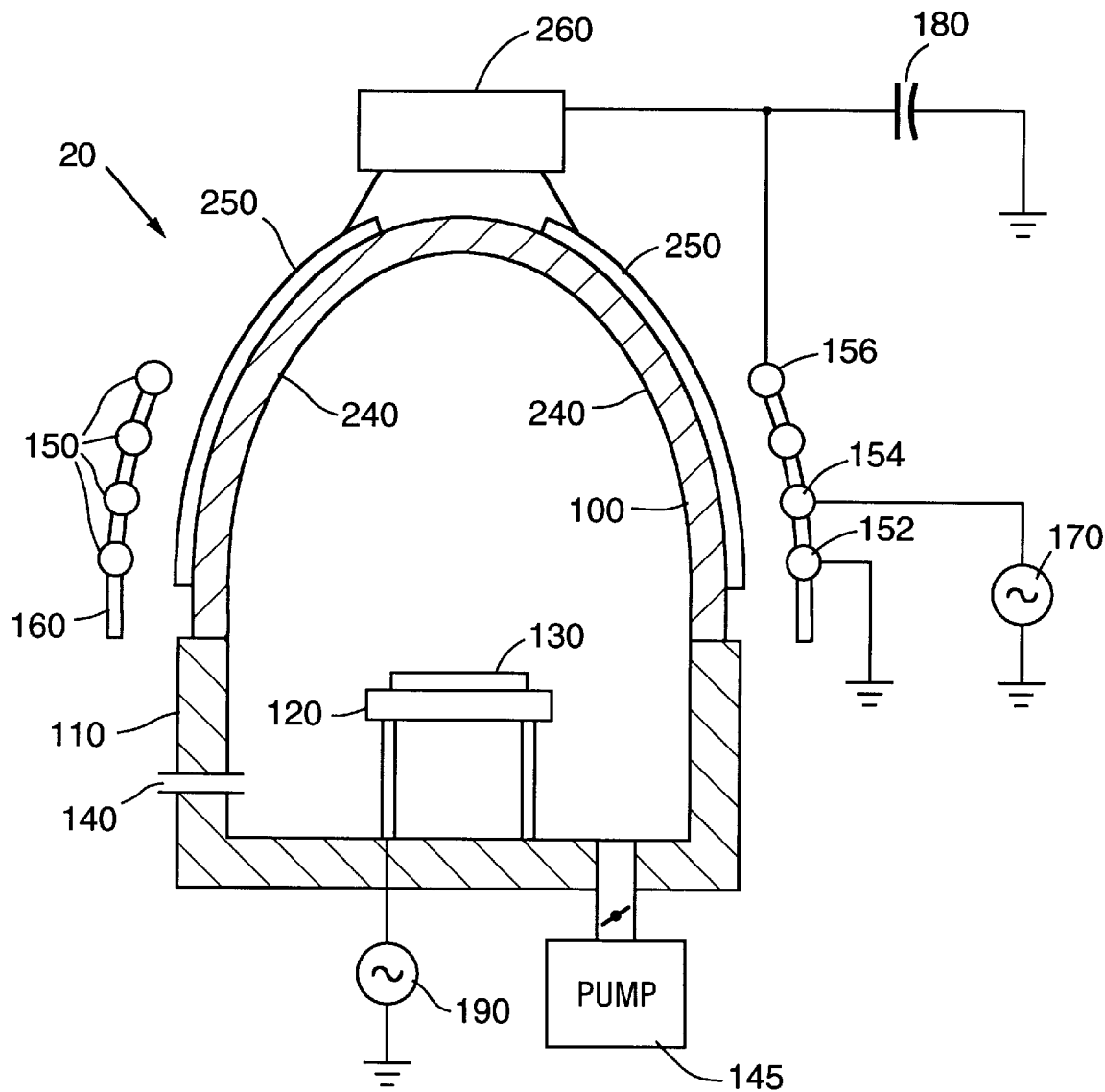
FIG. 3 shows a simplified full sectional view of a second embodiment of the present invention.
Figure 4:
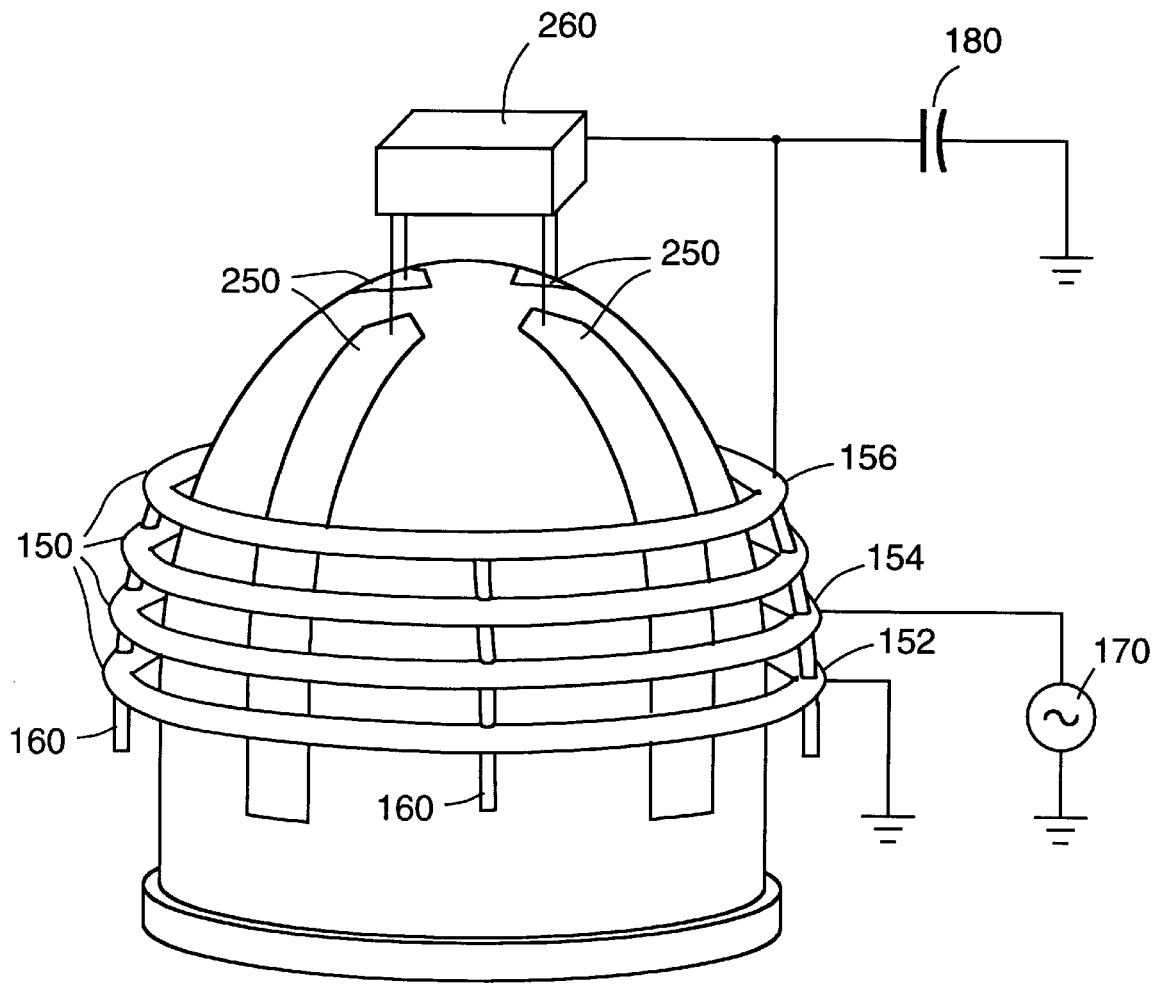
FIG. 4 shows a perspective top view of the embodiment shown in FIG. 3.

Another approach for carrying out the present invention is exemplified in FIGS. 3 and 4.

In this embodiment of the invention, a plurality of conducting strips 250 are fixed to the outside of the reactor vessel. Unlike the first embodiment, these strips do not rotate about the outside of the reactor vessel. The strips 250 are electrically connected to a winding of the RF coil 156 through a coupling device 260 and are electrically insulated from each other.

In operation, the plasma is ignited and sustained inductively by the RF coil 150. Alternatively, the plasma may be ignited capacitively using an additional electrode (not shown). The plasma is used to carry out processing on the workpiece 130 and a cleaning portion of the plasma is directed at the inner surface of the reactor vessel 240. The cleaning portion of the plasma is directed at the inner surface of the reactor vessel 240 as a result of the RF power supplied the plurality of conducting strips 250.

The coupling device 260 controls which strips are connected to the RF coil. In the present embodiment, at least one strip is connected at any instant in time. The cleaning portion of the plasma is directed at a section of the inner surface of the reactor vessel that is adjacent to the connected strip. The area of any connected strips is such that the portion of the plasma that it directs at the inner wall is sufficient to clean the inner wall, but small enough that the plasma processing of the workpiece is not substantially diminished. The coupling device 260 sequentially couples the strips to the RF coil. In this way, the spatial position of the inner surface area being cleaned changes with time. By spatially arranging the strips around the outside of the reactor vessel and sequentially coupling to them, the majority of the inner surface may be cleaned without substantially diminishing the plasma processing.

EXAMPLE 3

Figure 5:
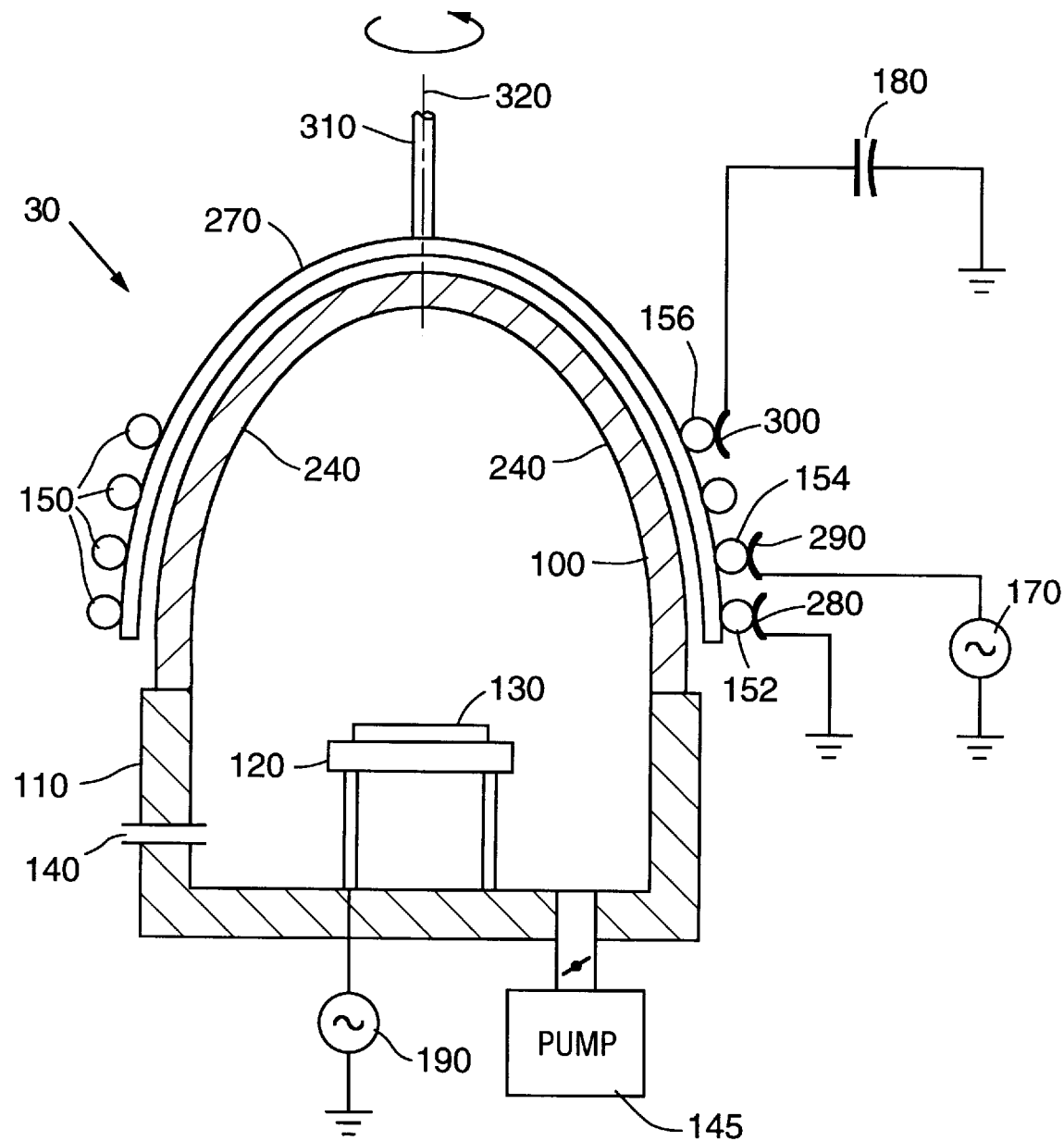
FIG. 5 shows a simplified full sectional view of a third embodiment of the present invention.
Figure 6:
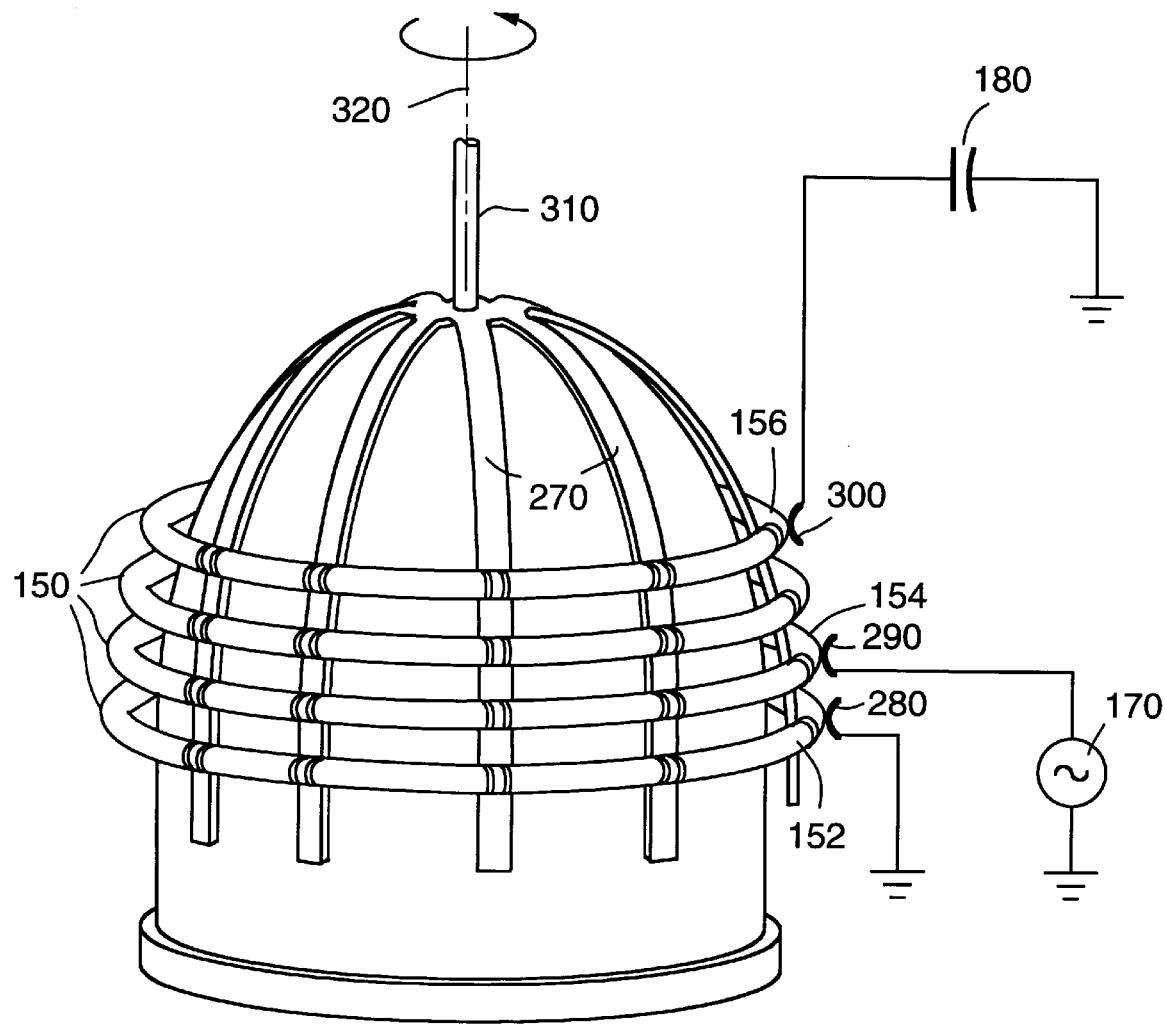
FIG. 6 shows a perspective top view of the embodiment shown in FIG. 5.

FIGS. 5 and 6 show a third embodiment of the present invention in which the RF coil 150 is mounted on a coil support 270. Both the coil 150 and coil support 270 are free to rotate about the reactor ceiling 100. The grounding of the RF coil 152, the coupling of the RF power source 170, and the coupling of the capacitor 180 are accomplished by means of electrical coupling components 280, 290, and 300. These coupling components are any devices that enable electrical connections to the coil while it is rotating. The coil support 270 is connected to a means for rotating the coil support by a connecting rod 310 and when in operation the coil support is rotated about an axis 320.

In this embodiment, there is no second electrode for directing a cleaning portion of the plasma at the inner surface of the reactor 240. Instead, the inventors have found that if the RF coil 150 is positioned close to the reactor ceiling 100, a portion of the plasma is directed at the inner surface of the reactor vessel adjacent to the coil windings.

In operation, the RF coil 150 inductively couples power to the gasses inside the reactor vessel to ignite and sustain a plasma. Alternatively, the plasma may be ignited capacitively using an additional electrode (not shown). The plasma is used for processing of the workpiece. Simultaneously with this processing, a cleaning portion of the plasma is directed at an inner surface area adjacent to the windings of the RF coil 150. The RF coil is rotated about the outside of the reactor ceiling so that the section of the inner surface adjacent to the coil windings changes with time. In this way, the majority of the inner surface of the reactor vessel is cleaned.

The embodiments and examples described above are intended to be illustrative of the present invention. They are not intended to be limiting. It is contemplated that modifications will readily occur to those skilled in the art and any such modifications that come within the scope of the following claims are covered by the present invention.

What is claimed is:

1. A method of processing a workpiece in a reactor vessel and simultaneously cleaning an inner surface of the reactor vessel, the inner surface of the reactor vessel having an area, the method comprising the steps of:

introducing into the reactor vessel at least one gas capable of sustaining a plasma;

producing and maintaining a plasma in the reactor vessel;

using the plasma to carry out processing of the workpiece; and directing a portion of the plasma at a section of the inner surface of the reactor vessel, the section having an area that is smaller than the area of the inner surface of the reactor vessel and having a time-varying spatial position on the inner surface of the reactor vessel.

2. A method as in claim 1, and wherein the step of directing a portion of the plasma comprises:

providing a conductive strip outside of the reactor vessel, the conductive strip having the smaller area; and rotating the conductive strip around the reactor vessel.

3. A method of processing a workpiece in a reactor vessel and simultaneously cleaning an inner surface of the reactor vessel having an area, the method comprising the steps of:

introducing into the reactor vessel at least one gas capable of sustaining a plasma;

utilizing an RF coil disposed outside of the reactor vessel to supply power simultaneously having both an inductive component and a capacitive component, the inductive component producing and sustaining a plasma in the reactor vessel for processing the workpiece; and cooperatively utilizing the RF coil and a conducting member disposed outside the reactor vessel such that the capacitive component of the power directs at the inner surface of the reactor vessel a portion of the plasma, the portion capable of cleaning a section of the inner surface of the reactor vessel such that the cleaning of the section occurs simultaneously with the processing of the workpiece.

4. A method as in claim 3 and wherein the section of the inner surface of the reactor vessel has an area smaller than the area of the inner surface of the reactor vessel.

5. A method as in claim 4 and wherein the section has a time-varying spatial position on the inner surface of the reactor vessel.

6. An apparatus for processing a workpiece, the apparatus comprising:

a reactor vessel having an inner surface and that contains the workpiece;

means for producing and sustaining a plasma in the reactor vessel for processing the workpiece; and means for directing, simultaneously with the processing of the workpiece, a portion of the plasma at the inner surface of the reactor vessel for cleaning the inner surface of the reactor vessel, whereby the cleaning of the inner surface of the reactor vessel occurs simultaneously with the processing of the workpiece.

7. The apparatus according to claim 6, wherein the means for producing and sustaining the plasma is an inductive means.

8. The apparatus according to claim 7, wherein the RF coil is arranged outside of the reactor vessel.

9. An apparatus for processing a workpiece, the apparatus comprising:
- a reactor vessel having an inner surface and that contains the workpiece, the inner surface of the reactor vessel having an area;
- means for producing and sustaining a plasma in the reactor vessel for processing the workpiece; and
- means for directing a portion of the plasma at the inner surface of the reactor vessel; and
- wherein the portion of the plasma is directed at a section of the inner surface of the reactor vessel, and
- wherein the section has an area that is smaller than the area of the inner surface of the reactor vessel and has a timing-varying spatial position on the inner surface of the reactor vessel.

10. An apparatus for processing a workpiece, the apparatus comprising:
- a reactor vessel having an inner surface and that contains the workpiece, the inner surface of the reactor vessel having an area;
- means for producing and sustaining a plasma in the reactor vessel for processing the workpiece;
- a conducting strip disposed outside of the reactor vessel, having an area that is smaller than the area of the inner surface of the reactor vessel and an axis about which it is pivotally mounted, and being electrically connected to the means for producing and sustaining the plasma; and
- means connected to the conducting strip for rotating the conducting strip around the reactor vessel.

11. The apparatus according to claim 6, wherein the means for directing a portion of the plasma at the inner surface of the reactor vessel comprises:
- a number of conducting strips arranged outside of the reactor vessel and electrically insulated from each other; and wherein
- the apparatus further comprises a coupling device for electrically connecting the conducting strips to the means for producing and sustaining the plasma, the electrical coupling device being such that at any one time a subset of some but not all of the conducting strips are connected to the means for producing and sustaining the plasma, the subset having a total area that is smaller than the area of the inner surface of the reactor vessel, and the conducting strips that are members of the subset varies in time.

12. An apparatus for processing a workpiece using a plasma, comprising:
- a reactor vessel within which the plasma is sustained and processing is carried out;
- a conducting strip pivotally mounted outside of the reactor vessel;
- means for rotating the conducting strip about an axis, the means for rotating the conducting strip being connected to the conducting strip; and
- an RF coil for maintaining the plasma, the coil arranged outside of the reactor vessel and electrically connected to the conducting strip,
- wherein the conducting strip directs a portion of the plasma toward a section of the reactor vessel.

13. The apparatus according to claim 12, wherein the conducting strip conforms with an outer surface of the reactor vessel but is free to move independently of the outer surface of the reactor vessel.

14. The apparatus according to claim 13, wherein the conducting strip has an area that is smaller than the area of the outer surface of the reactor vessel.

15. The apparatus according to claim 13, wherein the RF coil conforms with the outer surface of the reactor vessel.

16. The apparatus according to claim 15, wherein the RF coil is arranged so that the conducting strip is positioned between the outer surface of the reactor vessel and the RF coil.

17. The apparatus according to claim 16, wherein the reactor vessel is dome shaped and has an axis about which it is substantially rotationally invariant; and
- the axis of the conducting strip is collinear with the reactor vessel axis.

18. An apparatus for processing a workpiece using a plasma, comprising:
- a reactor vessel within which the plasma is sustained and processing is carried out;
- an RF coil arranged outside of the reactor vessel, the coil providing power and producing and sustaining the plasma about the workpiece;
- a number of conducting strips being arranged outside of the reactor vessel and being electrically insulated from each other; and
- a coupling device for electrically connecting the conducting strips to the RF coil, the electrical coupling device being such that at any one time a subset of some but not all of the conducting strips are connected to RF coil, wherein the subset directs a portion of the plasma at an inner surface of the reactor vessel and has a total area that is smaller than the area of the inner surface, and whereby the conducting strips that are members of the subset varies in time.

19. The apparatus according to claim 18, wherein the reactor vessel has an outer surface, the outer surface having an area; and
- the subset of connected conducting strips has a total area that is smaller than the area of the outer surface of the reactor vessel.

20. The apparatus according to claim 18, wherein the reactor vessel has an outer surface; and
- the conducting strips conform with the outer surface of the reactor vessel.

21. The apparatus according to claim 20, wherein the RF coil conforms with, but does not contact, the outer surface of the reactor vessel; and
- the RF coil is arranged so that the conducting strips are positioned between the outer surface of the reactor vessel and the RF coil.

22. A self-cleaning apparatus for processing a workpiece, the apparatus comprising:
- a reactor vessel having an inner surface and that contains the workpiece;
- an RF coil disposed outside of the reactor vessel, the RF coil supplying power simultaneously having both an inductive component and a capacitive component; and
- a conducting member disposed outside of the reactor vessel; and
- wherein the inductive component of the power produces and sustains a plasma in the reactor vessel for processing the workpiece; and
- wherein the RF coil and the conducting member cooperate such that the capacitive component of the power directs at the inner surface of the reactor vessel a portion of the plasma, the portion capable of cleaning the inner surface of the reactor vessel such that the cleaning of the inner surface of the reactor vessel occurs simultaneously with the processing of the workpiece.

23. A self-cleaning apparatus for processing a workpiece, the apparatus comprising:

a reactor vessel having an inner surface and that contains the workpiece;

an RF coil disposed outside of the reactor vessel, the RF coil supplying power simultaneously having both an inductive component and a capacitive component; and a conductive member disposed outside of the reactor vessel; and wherein the inductive component of the power produces and sustains a plasma in the reactor vessel for processing the workpiece; and wherein the RF coil and the conducting member cooperate such that the capacitive component of the power directs at the inner surface of the reactor vessel a portion of the plasma, the portion capable of cleaning the inner surface of the reactor vessel such that the cleaning of the inner surface of the reactor vessel occurs simultaneously with the processing of the workpiece; and wherein the RF coil has an axis about which it is pivotally supported; and the apparatus further comprise means connected to the RF coil for rotating the RF coil about its axis.

24. The apparatus according to claim 23, wherein the reactor vessel has an outer surface; and the RF coil conforms with the outer surface of the reactor vessel but is free to move independently of the outer surface.

25. The apparatus according to claim 24, wherein the reactor vessel is dome shaped, the reactor vessel having an axis about which it is substantially rotationally invariant; and the axis of the RF coil is collinear with the reactor vessel axis.

26. A self-cleaning apparatus for processing a workpiece, the apparatus comprising:

a reactor vessel having an inner surface and that contains the workpiece;

an RF coil disposed outside of the reactor vessel, the RF coil supplying power simultaneously having an inductive component and a capacitive component; and a conducting member disposed outside of the reactor vessel; and wherein the inductive component of the power produces and sustains a plasma in the reactor vessel for processing the workpiece; and wherein the RF coil and the conducting member cooperate such that the capacitive component of the power directs at the inner surface of the reactor vessel a portion of the plasma, the portion capable of cleaning the inner surface of the reactor vessel such that the cleaning of the inner surface of the reactor vessel occurs simultaneously with the processing of the workpiece; and wherein the portion of the plasma directed by the inductive component of the power is directed at a section of the inner surface of the reactor vessel having an area that is smaller than the area of the inner surface of the reactor vessel, the section of the inner surface having a time-varying spatial position on the inner surface.

* * * * *